(12) United States Patent　(10) Patent No.: US 11,050,487 B2
Jiang et al.　(45) Date of Patent: Jun. 29, 2021

(54) METHOD AND APPARATUS FOR LASER FREQUENCY CONTROL

(71) Applicant: HUAWEI TECHNOLOGIES CO., LTD., Guangdong (CN)

(72) Inventors: Zhiping Jiang, Kanata (CA); Xuefeng Tang, Kanata (CA); Haitao Sun, Ottawa (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/927,245

(22) Filed: Jul. 13, 2020

(65) Prior Publication Data

US 2021/0021340 A1　Jan. 21, 2021

Related U.S. Application Data

(60) Provisional application No. 62/874,233, filed on Jul. 15, 2019.

(51) Int. Cl.
　*H04B 10/079*　(2013.01)
　*H04B 10/572*　(2013.01)
　(Continued)

(52) U.S. Cl.
　CPC ... *H04B 10/07955* (2013.01); *H04B 10/0793* (2013.01); *H04B 10/07957* (2013.01);
　(Continued)

(58) Field of Classification Search
　CPC .......... H04B 10/0793; H04B 10/07955; H04B 10/07957; H04B 10/506; H04B 10/572;
　(Continued)

(56) References Cited

U.S. PATENT DOCUMENTS

| | | | | |
|---|---|---|---|---|
| 5,202,781 A | * | 4/1993 | Heck | H04B 10/40 398/128 |
| 5,267,074 A | * | 11/1993 | Kluitmans | H04J 14/0298 398/139 |

(Continued)

FOREIGN PATENT DOCUMENTS

| | | |
|---|---|---|
| CN | 109088673 A | 12/2018 |
| WO | 2015022034 A1 | 2/2015 |

OTHER PUBLICATIONS

International Search Report issued in co-pending application PCT/CN2020/102004 dated Oct. 20, 2020.

*Primary Examiner* — Li Liu

(74) *Attorney, Agent, or Firm* — BCF LLP

(57) ABSTRACT

The disclosed systems, apparatuses and methods are directed to controlling a difference between a first center frequency of a first optical subcarrier and a second center frequency of a second optical subcarrier of an optical super-channel signal in an optical network. The method comprises modulating the first optical subcarrier at a first optical side component frequency with a first side modulation frequency and modulating the second optical subcarrier at a second optical side component frequency with a second side modulation frequency. The method further comprises detecting a radio-frequency (RF) power at a modulated beat frequency tone in the modified optical signal.

14 Claims, 12 Drawing Sheets

(51) Int. Cl.
*H04J 14/02* (2006.01)
*H04B 10/50* (2013.01)

(52) U.S. Cl.
CPC ......... *H04B 10/504* (2013.01); *H04B 10/572* (2013.01); *H04J 14/02* (2013.01); *H04J 14/0221* (2013.01); *H04B 2210/006* (2013.01)

(58) Field of Classification Search
CPC .. H04B 2210/006; H04J 14/02; H04J 14/0224
USPC ................................ 398/34, 76, 79, 95, 196
See application file for complete search history.

(56) References Cited

U.S. PATENT DOCUMENTS

| | | | | |
|---|---|---|---|---|
| 5,537,634 | A * | 7/1996 | Fye | H04J 14/0298 398/76 |
| 5,600,466 | A * | 2/1997 | Tsushima | H04J 14/0212 398/1 |
| 6,714,741 | B1 * | 3/2004 | Van De Bergh | H04B 10/07 398/25 |
| 2004/0227942 | A1 * | 11/2004 | Law | G01B 9/02003 356/364 |
| 2012/0251101 | A1 * | 10/2012 | McNicol | H04B 10/506 398/25 |
| 2016/0191195 | A1 * | 6/2016 | Magri | H04B 10/572 398/79 |
| 2017/0222716 | A1 * | 8/2017 | Nakashima | H04B 10/0795 |
| 2019/0238253 | A1 * | 8/2019 | Frog | G02B 6/12033 |
| 2020/0136350 | A1 * | 4/2020 | Joffe | H01S 5/0078 |

\* cited by examiner

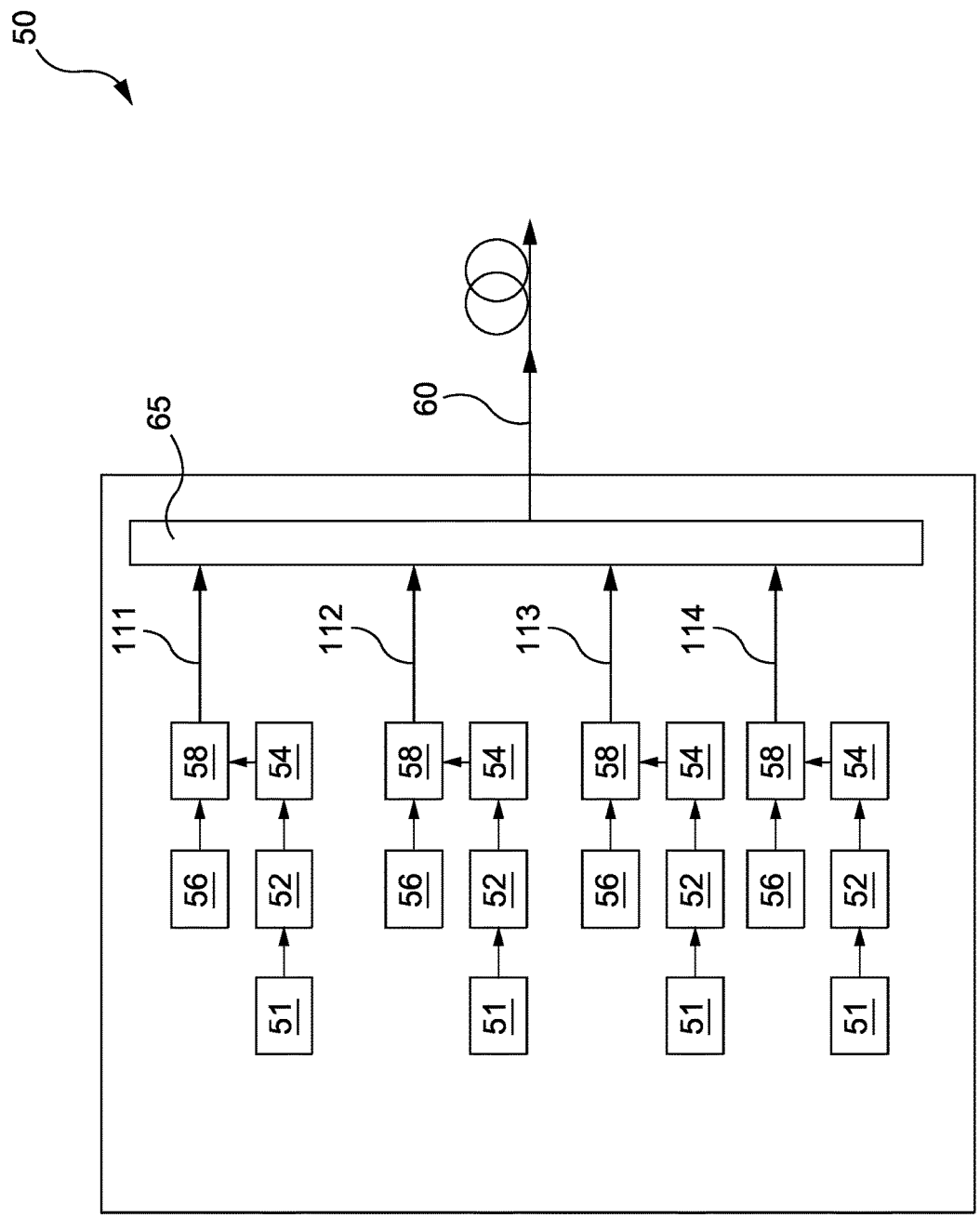

METHOD AND APPARATUS FOR LASER FREQUENCY CONTROL

CROSS-REFERENCE TO RELATED APPLICATIONS

This application claims the benefit of priority to U.S. Patent Application Ser. No. 62/874,233 filed on Jul. 15, 2019 and entitled "Method and Apparatus for Laser Frequency Control", the contents of which are incorporated herein by reference.

FIELD

The present disclosure generally relates to the field of optical networks and, in particular, to method and apparatus for laser frequency control.

BACKGROUND

Long-haul wavelength division multiplexing (WDM) optical networks are configured to transmit optical channel signals over a few hundred kilometers. However, the capacity of conventional optical channel in WDM networks is limited to about 200 Gigabits/s (Gbit/s). To increase the channel capacity beyond this limit and to take advantage of WDM interface, optical super-channel signals may be used.

An optical super-channel signal transmits data in optical super-channels. A super-channel is an optical channel that binds several subcarriers for unified transmission. Each subcarrier is a signal with a single-wavelength spectrum. The subcarriers of one super-channel can be processed simultaneously by optical networks hardware. Using subcarriers in the optical super-channel may considerably increase the transmission capacity and spectral efficiency of the WDM networks by reducing a guard band between the subcarriers within the super-channel.

In the conventional optical channel signal, a guard band is required between any two optical channels in order to mitigate an optical filtering effect and neighboring channel crosstalk. There is no optical filtering between subcarriers in the super-channel. As such, the guard band between subcarriers in an optical super channel can be allocated based on consideration of only the mitigation of cross talk between channels. If the crosstalk is low and subcarrier frequencies are stable, the bandwidth allocated to the guard band between the subcarriers can be reduced. However, each subcarrier is generated by a laser that may manifest an optical frequency drift. Such an optical frequency drift for a particular laser may cause a drift of the corresponding subcarrier towards a neighboring subcarrier in the optical super-channel signal.

Therefore, there is a need for improvements in laser frequency control techniques that compensate for problems related to laser drift issues that may cause channel crosstalk in the optical super-channel signal.

SUMMARY

An objective of the present disclosure is to provide a technique for controlling subcarrier frequencies in an optical super-channel signal in order to improve performance of an optical network. The apparatuses, methods and systems as disclosed herein permit controlling a difference between a first center frequency of a first optical subcarrier and a second center frequency of a second optical subcarrier of a super-channel optical signal.

In accordance with this objective, an aspect of the present disclosure provides a method for controlling a difference between a first center frequency of a first optical subcarrier and a second center frequency of a second optical subcarrier of an optical super-channel signal in an optical network. The method comprises: modulating the first optical subcarrier at a first optical side component frequency with a first side modulation frequency; modulating the second optical subcarrier at a second optical side component frequency with a second side modulation frequency, a difference between the first optical side component frequency and the second optical side component frequency being smaller than a difference between the first center frequency and the second center frequency. The method further comprises coupling together the modulated first and second optical subcarriers to obtain a modified optical signal; and monitoring a variation of the difference between the first center frequency and the second center frequency by detecting a radio-frequency (RF) power at a modulated beat frequency tone in the modified optical signal. The modulated beat frequency tone bears information of the first side modulation frequency and the second side modulation frequency.

The monitoring a variation of the difference between the center frequencies of the first and the second optical subcarriers may further comprise: converting the modified optical signal to an electrical signal; filtering the electrical signal by a first electronic filter to obtain a filtered electrical signal within a first bandwidth corresponding to the difference between the first optical side component frequency and the second optical side component frequency; squaring the filtered electrical signal; filtering again the filtered and squared electrical signal by a second electronic filter to obtain an RF signal at the modulated beat frequency tone; and measuring the RF power of the RF signal at the modulated beat frequency tone.

In at least one embodiment, a difference between the first optical side component frequency and the first center frequency of the first subcarrier may be maintained constant. In at least one embodiment, a difference between the second optical side component frequency and the second center frequency of the second subcarrier may be maintained constant.

The method may further comprise detuning at least one of the first center frequency and the second center frequency to maximize the RF power of the RF signal at the modulated beat frequency tone.

In some embodiments, a sum of a power of a first side optical component at the first side optical component frequency and a power of a second optical component at the second side optical component frequency may be less than 1% of the total power of the optical signal.

In some embodiments, the modulated beat frequency tone may be a difference between the first side modulation frequency and the second side modulation frequency. In some embodiments, the modulated beat frequency tone is a sum of the first side modulation frequency and the second side modulation frequency.

In accordance with another aspect of the present disclosure, there is provided an apparatus for controlling an optical super-channel signal in an optical network, the optical super-channel signal having a first optical subcarrier with a first center frequency and a second optical subcarrier with a second center frequency. The apparatus comprises: a first electro-optic modulator configured to: modulate the first optical subcarrier at a first optical side component frequency with a first side modulation frequency; a second electro-optic modulator configured to: modulate the second optical subcarrier at a second optical side component frequency with a second side modulation frequency, a difference between the first optical side component frequency and the second optical side component frequency being smaller than a difference between the first center frequency and the second center frequency. The apparatus also comprises a coupler configured to couple together the modulated first and second optical subcarriers to obtain a modified optical signal; and an RF power meter configured to measure an RF power of an RF signal generated from the modified optical signal, the RF power being measured at a modulated beat frequency tone. The modulated beat frequency tone bears information of the first side modulation frequency and the second side modulation frequency.

The apparatus may further comprise: a photodetector configured to receive the modified optical signal and to generate an electrical signal; a first electronic filter configured to filter the electrical signal to obtain a filtered electrical signal within a first bandwidth corresponding to a difference between the first optical side component frequency and the second optical side component frequency, the first electronic filter configured to significantly attenuate the electrical signal around the first side modulation frequency and the second side modulation frequency; and a squaring device configured to square the filtered electrical signal.

The apparatus may further comprise an amplifier configured to amplify the electrical signal after it was generated by the photodetector. The apparatus may further comprise a second electronic filter located between the squaring device and the RF power meter and configured to filter again the filtered and squared electrical signal within a second bandwidth having a center corresponding to the modulated beat frequency tone to obtain the RF signal. The squaring device may comprise a splitter and a multiplier.

In some embodiments, the modulated beat frequency tone may be a difference between the first side modulation frequency and the second side modulation frequency. In some embodiments, the modulated beat frequency tone is a sum of the first side modulation frequency and the second side modulation frequency.

In at least one embodiment, a difference between the first optical side component frequency and the first center frequency of the first subcarrier may be maintained constant. In at least one embodiment, a difference between the second optical side component frequency and the second center frequency of the second subcarrier may be maintained constant.

In accordance with another aspect of the present disclosure, there is provided a non-transitory computer readable medium with computer executable instructions stored thereon that, when executed by a processor, cause the processor to: filter a digital signal to obtain a filtered digital signal within a first bandwidth by attenuating the digital signal around a first side modulation frequency and a second side modulation frequency; square the filtered digital signal; filter again the filtered and squared digital signal to obtain a radio-frequency (RF) signal at a modulated beat frequency tone, the modulated beat frequency tone bearing information of the first side modulation frequency and the second side modulation frequency; and determine an RF power of the RF signal at the modulated beat frequency tone. The modulated beat frequency tone may be a difference between the first side modulation frequency and the second side modulation frequency. The modulated beat frequency tone may be a sum of the first side modulation frequency and the second side modulation frequency.

BRIEF DESCRIPTION OF THE FIGURES

The features and advantages of the present disclosure will become apparent from the following detailed description, taken in combination with the appended drawings, in which:

FIG. 1A depicts a block diagram of a WDM transmitter for generating an optical super-channel signal, in accordance with at least one non-limiting embodiment of the present disclosure;

Figure 1B:
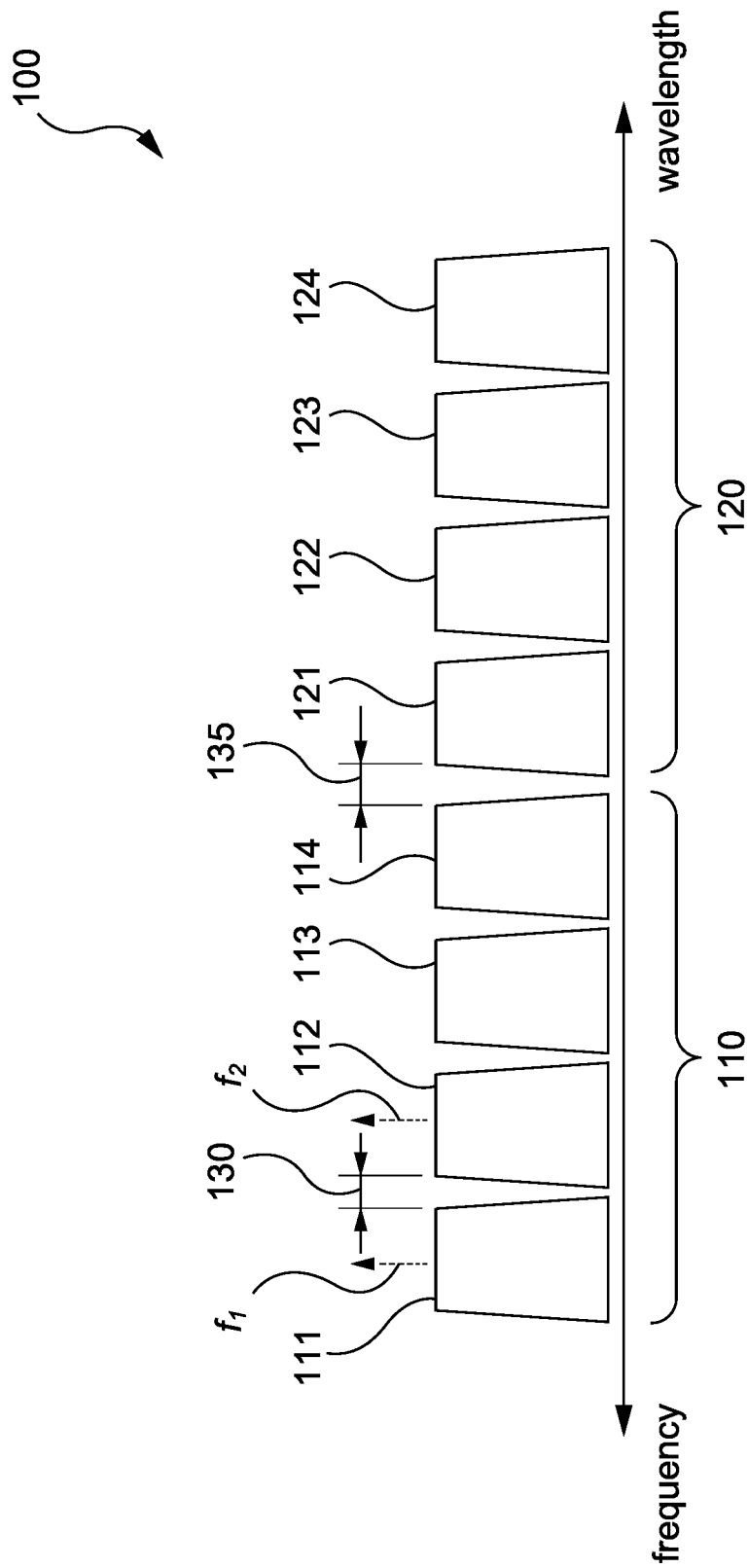
FIG. 1B illustrates a portion of the optical spectrum of the optical signal generated by the WDM transmitter depicted in FIG. 1A.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

The instant disclosure is directed to systems, methods and apparatuses to address the deficiencies of the current state of the art. To this end, the instant disclosure describes systems, apparatuses and methods directed to controlling a difference between a first center frequency of a first optical subcarrier and a second center frequency of a second optical subcarrier of an optical super-channel signal in an optical network.

Referring now to the drawings, FIG. 1A depicts a block diagram of a WDM transmitter 50 for generating an optical super-channel signal 60, in accordance with at least one non-limiting embodiment of the present disclosure. FIG. 1B illustrates a portion 100 of the optical spectrum of optical super-channel signal 60 generated by transmitter 50.

It should be understood that each subcarrier of optical super-channel signal 60 can be used to carry an independent signal. Each of these subcarriers is associated with a control branch within transmitter 50. Each of these branches comprises a transmitter digital signal processors (DSPs) 51, a digital to analog converter (DAC) 52, an electrical driver 54, a laser 56, and an electro-optical (EO) modulator 58. As shown in FIG. 1A, a plurality of branches are present, each of which corresponds to a respective super-channel subcarrier 111, 112, 113, 114. As depicted in FIG. 1A, in each branch, DSP 51 transmits a digital signal to a DAC 52, which converts the digital signal to an analog signal. The digital signal is the data signal to be encoded for transmission. The EO modulator 58 may be modulated electrically by electrical drivers 54 in accordance with the analog signal output by DAC 52. The output of laser 56 is optically modulated by EO modulator 58. A coupler 65 may be used to combine separate subcarriers (e.g. 111, 112, 113, 114, etc.) generated by each of the branches into one optical super-channel signal 60. If each of the lasers is tuned to a different frequency, the coupling of the generated subcarriers can be a rather simple process.

It is contemplated that transmitter 50 may also comprise other devices, and the technology described herein is not limited to the embodiment illustrated in FIG. 1A.

FIG. 1B depicts two super-channels 110, 120. Each super-channel 110, 120 comprises four subcarriers: four super-channel subcarriers 111, 112, 113, and 114 in the first super-channel 110 and four super-channel subcarriers 121, 122, 123, 124 in the second super-channel 120.

A guard band is typically required between neighboring super-channels 110, 120 and between neighboring subcarriers (111, 112, 113, 114 and 121, 122, 123, 124) in order to mitigate the effects of crosstalk. In order to improve spectral efficiency, a subcarrier guard band 130 between neighboring subcarriers in the same super channel (for example, between neighboring subcarriers 111 and 112) may be narrower than a super-channel guard band 135 located between neighboring super-channels 110, 120. Typically, subcarrier guard band 130 between neighboring subcarriers may be on the order of a few GHz.

Referring again to FIG. 1B, each subcarrier 111, 112, 113, 114 of super-channel 110 is generated by a different laser 56. Each laser 56 has a laser optical frequency which corresponds to a center frequency of the corresponding subcarrier. For example, in FIG. 1B, subcarrier 111 has a center frequency $f_1$ (illustrated by an arrow). Also in FIG. 1B, subcarrier 112 has a center frequency $f_2$ (also illustrated by an arrow). Thus, the laser associated with subcarrier 111 would have a laser optical frequency of $f_1$ and the laser associated with subcarrier 112 would have a laser optical frequency of $f_2$.

Due to changes in temperature during operation, differences between an operating temperature and the temperature at which a calibration was performed, and other such effects, the laser optical frequency may drift with time. The drift of the laser optical frequency over time may be as high as +/−2.5 GHz. Such frequency drift may significantly contribute to an undesired variation of frequency spacing between the subcarriers. An additional guard band between subcarriers is usually introduced to take into account such laser frequency drift. This guard band may be defined on the basis of a worst case drift from two different lasers (e.g. each of the lasers drifting towards the other). This increased guard band reduces the spectral efficiency of the system. The technique described herein may help to reduce the bandwidth allocated to guard bands between the subcarriers attributable to accommodating the laser frequency draft. The technique described herein permits reducing the variation of spacing between frequencies of the lasers that generate the subcarriers and to improve the relative stability of subcarriers in the super-channel.

The technique described herein permits reduce variation of the frequency difference $|f_2-f_1|$ between two neighboring subcarriers (also referred to herein as a "subcarrier spacing").

Figure 2:
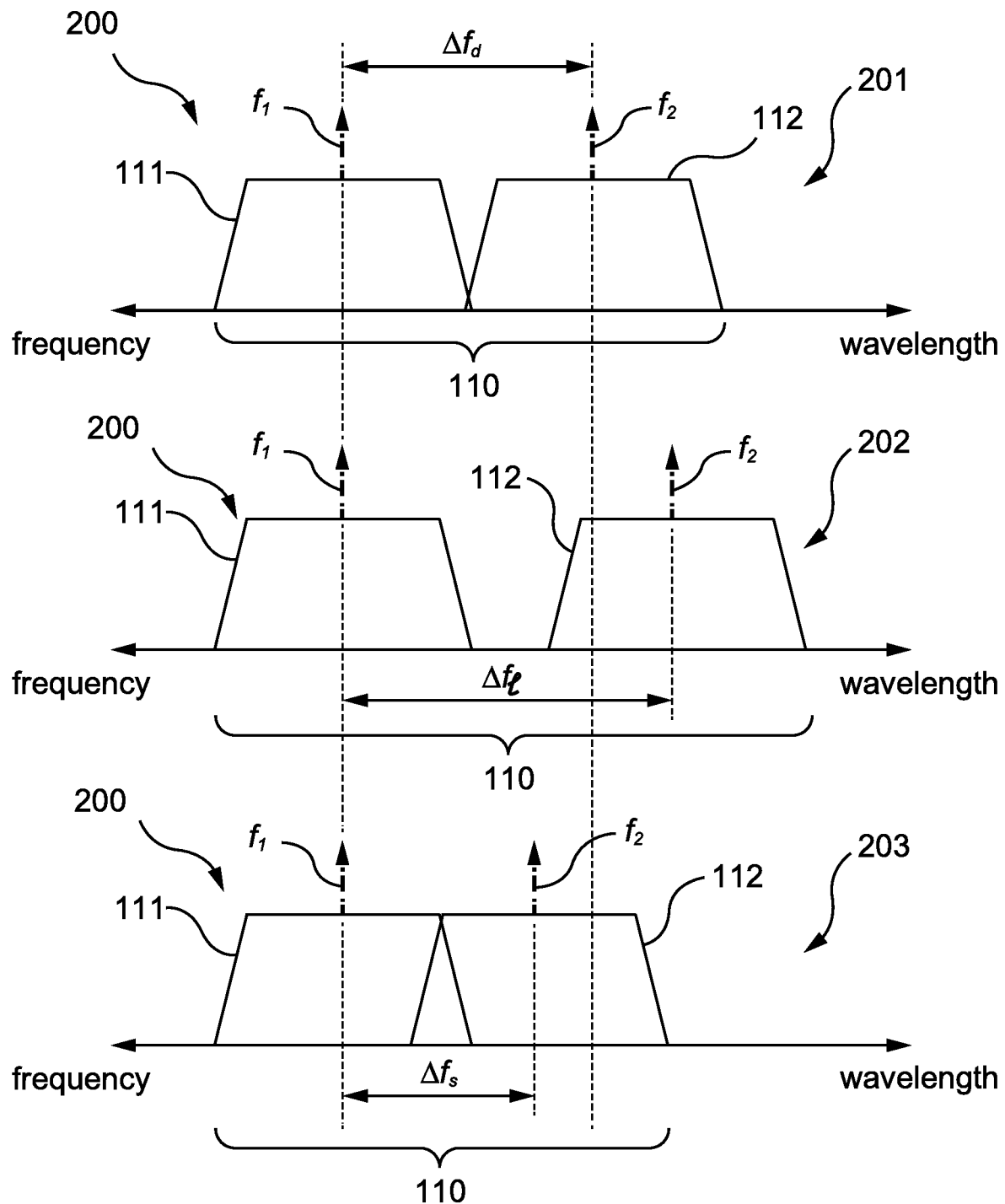
FIG. 2 illustrates consequences of the drift of the optical center frequency of one of lasers in the transmitter of FIG. 1.

FIG. 2 illustrates consequences of the drift of the optical frequency of one of lasers 56 in transmitter 50.

A portion 200 of the spectrum of optical signal 60 contains two neighboring subcarriers 111 and 112 of super-channel 110. First subcarrier 111 has a subcarrier center frequency $f_1$, and second subcarrier 112 has a subcarrier center frequency $f_2$.

In FIG. 2, scenario 201 illustrates first and second subcarriers 111, 112 when they have optimal desired subcarrier spacing. The difference between optical frequencies $f_1$ and $f_2$ is approximately equal to the desired frequency difference $\Delta f_d$. The desired variation of a subcarrier spacing ($f_1$-$f_2$) may be, for example, a few MHz.

Scenario 202 illustrates first and second subcarriers 111, 112 when they are located too far from each other. In such case, the difference $\Delta f_l$ between optical frequencies $f_1$ and $f_2$ is larger than $\Delta f_d$. Therefore, a portion of the spectrum is wasted.

Scenario 203 illustrates first and second subcarriers 111, 112 when they are located too close to each other, so that optical frequency difference $\Delta f_s$ between first and second subcarriers 111, 112 is less than $\Delta f_d$. In this case, the crosstalk between first and second subcarriers 111, 112 is higher than desired.

In accordance with at least one embodiment of the present disclosure, a modified optical signal is generated in order to control the subcarrier spacing.

Figure 3:
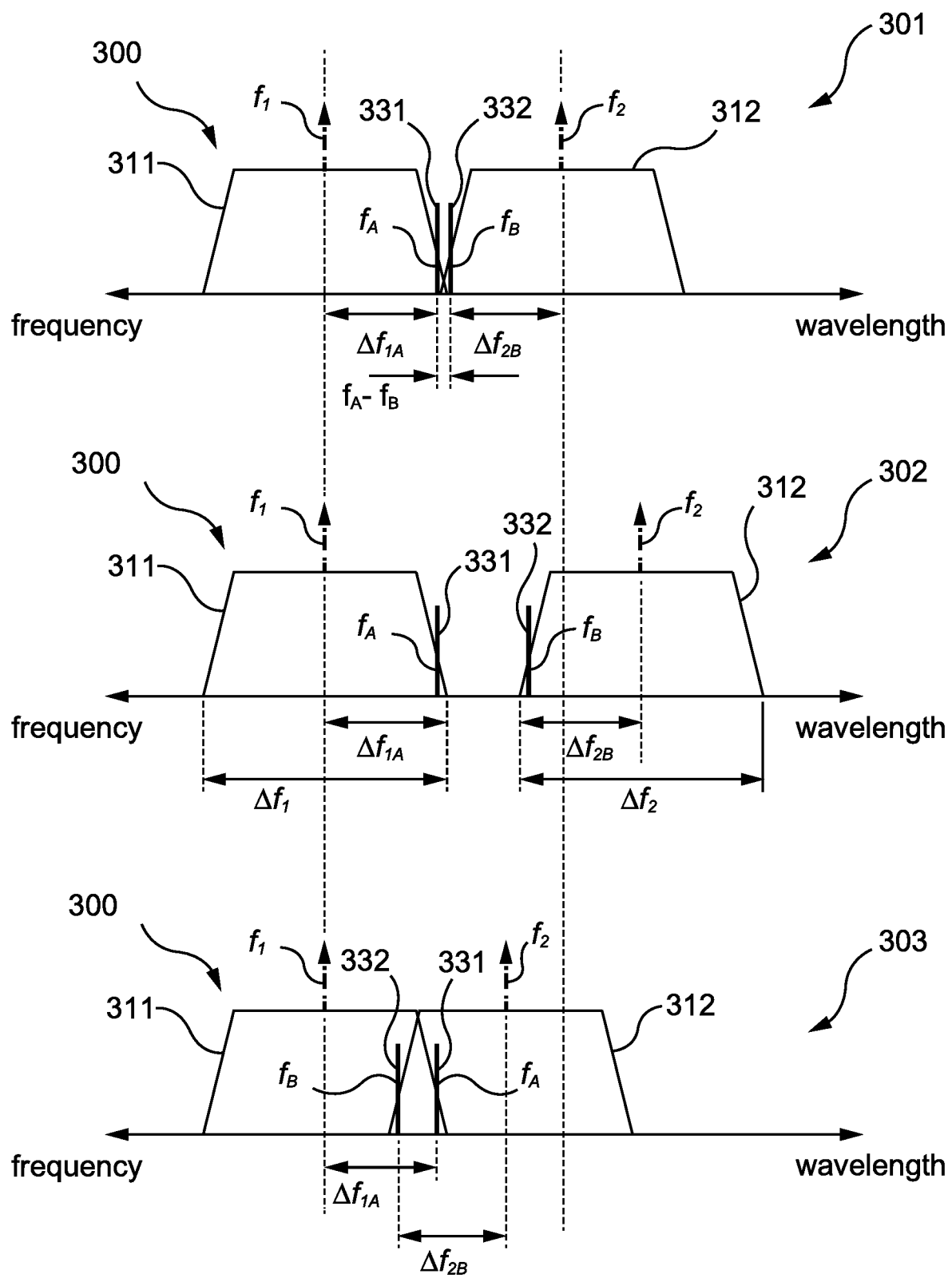
FIG. 3 illustrates a portion of a spectrum of a modified optical signal, generated in accordance with various embodiments of the present disclosure.

FIG. 3 illustrates a portion 300 of a spectrum of the modified optical signal, generated in accordance with at least one embodiment of the present disclosure. The modified optical signal contains first and second side frequency components 331, 332. The first side frequency component 331 has frequency $f_A$. The second side frequency component 332 has frequency $f_B$. In some embodiments, first and second side frequency components 331, 332 may be generated on neighboring edges of first and second subcarriers 311, 312. As is described herein below, these first and second side frequency components 331, 332 are used to monitor the subcarrier spacing ($f_1$-$f_2$) between first and second subcarriers 311, 312.

In at least one embodiment, a frequency difference $\Delta f_{1A}$ between optical center frequency $f_1$ of first subcarrier 311 and frequency $f_A$ of first side frequency component 331 is maintained as constant. The optical center frequency $f_1$ of first subcarrier 311 may drift away from the desired frequency due to the drift of the laser 56 that generates first subcarrier 311. The frequency $f_A$ of first side frequency component 331 also follows the drift of the subcarrier frequency $f_1$ of first subcarrier 311. Therefore, by monitoring the difference between frequencies $f_A$, $f_B$ of side frequency components 331, 332 of neighboring subcarriers 311, 312, it is possible to monitor the subcarrier spacing.

FIG. 3 illustrates the drift of subcarrier 312, in accordance with at least one embodiment of the present disclosure. For simplicity of the illustration, center frequency $f_1$ of first subcarrier 311 is maintained constant in FIG. 3. It is contemplated that center frequencies of any subcarrier of one super-channel may increase or decrease.

Scenario 301 illustrates first and second subcarriers 311, 312 when they have optimal desired subcarrier spacing. Scenario 302 illustrates first and second subcarriers 311, 312 when they are located too far from each other. In scenario 302, when subcarrier center frequency $f_2$ decreases, the frequency difference between subcarrier center frequencies $f_1$, $f_2$ of first subcarrier 311 and second subcarrier 312, respectively (i.e. subcarrier spacing) increases. The frequency difference $\Delta f_{AB}$ between frequencies of first and second side frequency components 331, 332 also increases.

When the center frequency $f_2$ increases (scenario 303), the subcarrier spacing ($f_1-f_2$) decreases. The frequency difference $\Delta f_{AB}$ between frequencies of first and second side frequency components 331, 332 also decreases.

Figure 1C:
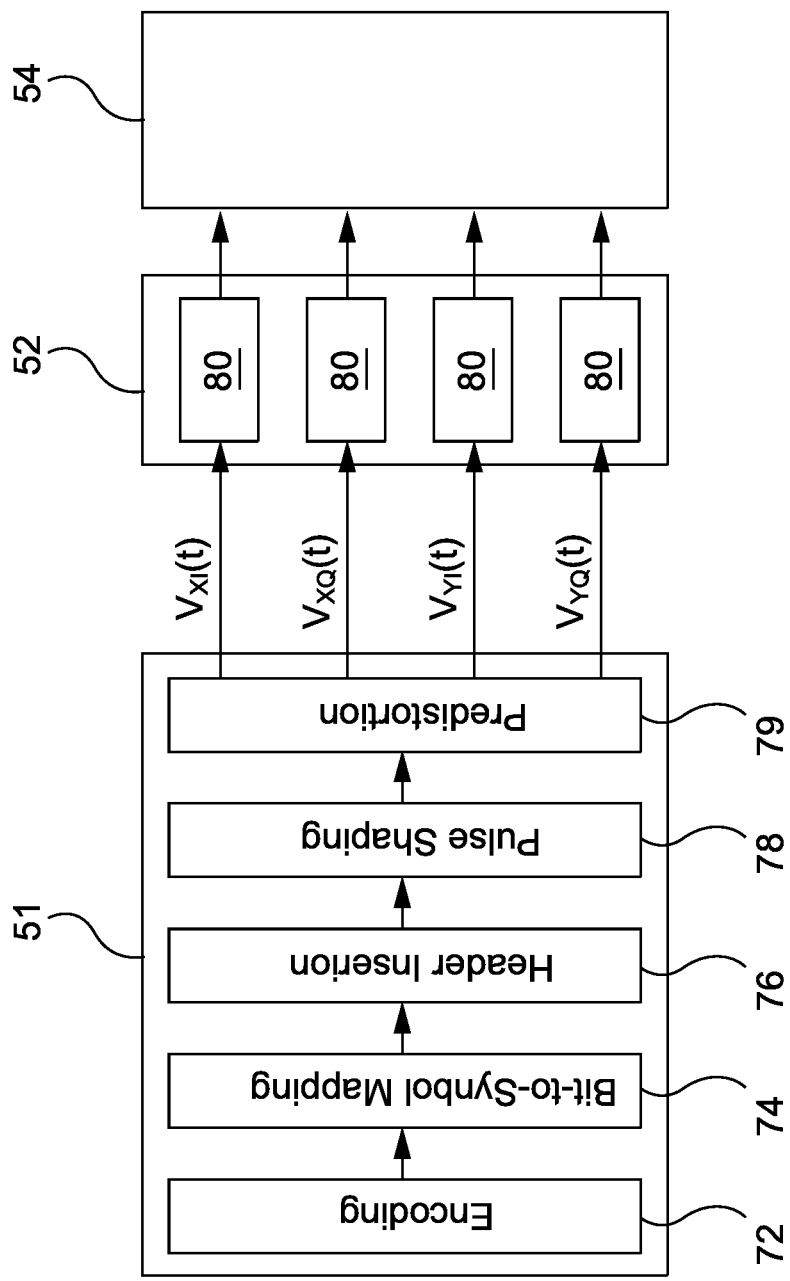
FIG. 1C depicts a block diagram of logical blocks of a digital signal processor and a digital to analog converter (DAC) module of the transmitter of FIG. 1A, in accordance with at least one non-limiting embodiment of the present disclosure.

Referring now to FIG. 1C, which depicts a block diagram of logical blocks of DSP 51, DAC module 52 of transmitter 50, and electrical driver 54 of FIG. 1A, in accordance with at least one non-limiting embodiment of the present disclosure. There are four data streams for dual-polarization QAM transmitter 50. The logical blocks of DSP 51 may comprise: encoding block 72, bit-to-symbol mapping block 74, header insertion block 76, pulse shaping block 78, and pre-distortion block 79. It should be noted that DSP 51 may have other configuration and structure. DAC module 52 has four DAC units 80.

As illustrated in FIG. 1C, DSP 51 transmits four V(t) signals to DAC module 52, one V(t) signal for each DAC unit 80. These four V(t) signals are: two signals in X-polarization $V_{XI}(t)$, $V_{XQ}(t)$, and two signals in Y-polarization $V_{YI}(t)$, $V_{YQ}(t)$. I and Q correspond to in-phase and quadrature phase signals, respectively.

The desired optical output with optical subcarrier may be obtained when $V_{XI}(t)$, $V_{XQ}(t)$, $V_{YI}(t)$, $V_{YQ}(t)$ are applied to EO modulator 58 and EO modulator 58 is an in-phase quadrature phase MZM (IQ-MZM).

The resulting field may be described as:

$$E_{X0}(t)=V_{XI}(t)+\text{sqrt}(-1)*V_{XQ}(t) \quad (1)$$

The equation (1) is for X polarization of the field. The field in Y polarization can be described with a similar equation.

The transmitter 50 with DSP 51 and DAC module 52 of FIG. 1C transmits optical super-channel signal illustrated in FIG. 1B.

In at least one embodiment, in order to generate the modified optical signal containing subcarriers 311, 312 with side frequency components 331, 332, a side frequency component generation logical block is added in DSP 51 of transmitter 50.

Figure 4:
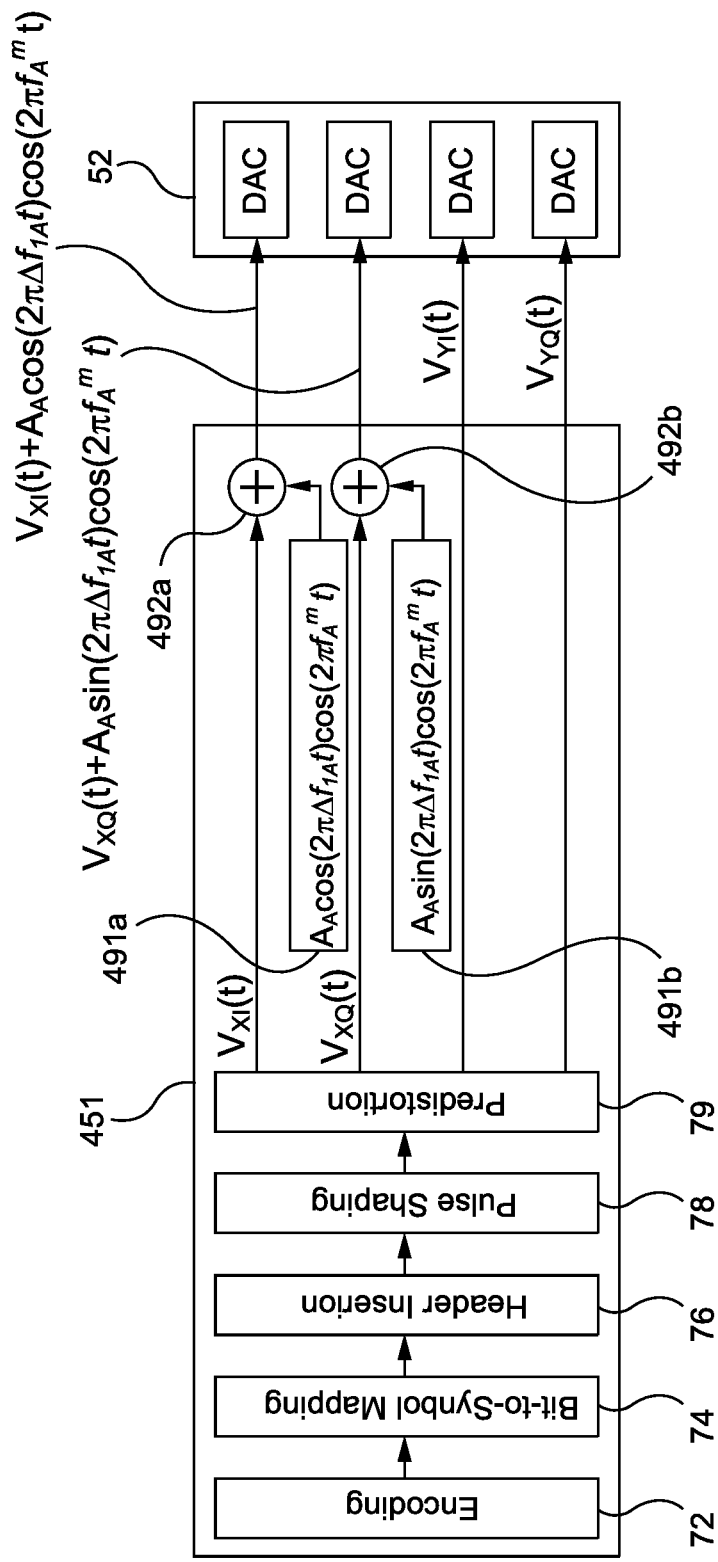
FIG. 4 depicts a block diagram of logical blocks of a modified DSP and DAC module for generation of optical super-channel signal with side frequency components, in accordance with various embodiments of the present disclosure.

FIG. 4 depicts a block diagram of logical blocks of a modified DSP 451 and DAC module 52 for generation of optical super-channel signal with side frequency components, in accordance with at least one non-limiting embodiment of the present disclosure. To generate modified optical signals 311, 312 with side frequency components 331, 332, DSP 51 in transmitter 50 is replaced with modified DSP 451 of FIG. 4.

FIG. 4 illustrates how the side frequency component with amplitude modulation is applied in X polarization. Mathematical operations of adding are applied in digital domain.

The following term (corresponds to block 491a in FIG. 4) is added to $V_{XI}(t)$ signal in X-polarization at adder 492a:

$$A_A \cos(2\pi\Delta f_{1A}t)\cos(2\pi f_A^m t). \quad (2)$$

Therefore, DSP 451 transmits to DAC module 52 the I-component in X polarization of V(t) signal that can be written as follows:

$$V_{XI}(t)+A_A \cos(2\pi\Delta f_{1A}t)\cos(2\pi f_A^m t) \quad (3)$$

The following term (corresponds to block 491b in FIG. 4) is added at to $V_{XQ}(t)$ signal in X-polarization at adder 492b:

$$A_A \sin(2\pi\Delta f_{1A}t)\cos(2\pi f_A^m t). \quad (4)$$

DSP 451 transmits to DAC module 52 the Q-component in X polarization of V(t) signal that can be written as follows:

$$V_{XQ}(t)+A_A \sin(2\pi\Delta_{A1}t)\cos(2\pi f_A^m t) \quad (5)$$

Adder 492b adds term (4), which corresponds to block 491b, to $V_{XI}(t)$ signal in X polarization, the Q-component in X-polarization of V(t)

Optionally, similar terms may be added to corresponding V(t) components in Y polarization.

As a result of using DSP 451 in transmitter 50, the optical signal has an optical side component frequency $f_A$ with a side frequency component modulation frequency $f_A^m$.

Referring also to FIG. 3, the frequency difference $f_{1A}$ between subcarrier center frequency $f_1$ of first subcarrier 311 and optical side component frequency $f_A$ of first side frequency component 331 may be maintained very accurately, because the side frequency component is generated digitally in DSP 451. An error may be due to a clock error in transmitter 50. However, such clock error may be less than 20 parts per million (ppm). For example, for frequency difference $f_{1A}=34$ GHz, the maximum error may be 0.68 MHz.

The first side frequency component 331 having optical side component frequency $f_A$ is modulated at first modulation frequency $f_A^m$. A second side frequency component 332 with optical side component frequency $f_B$ is modulated at second modulation frequency $f_B^m$. It is contemplated that other subcarriers may have side frequency components that are modulated with corresponding side frequency component modulation frequencies $f_i^m$.

Each side optical frequency component 331, 332 has a very narrow spectrum, which is determined by the modulation frequency $f_A^m$, $f_B^m$. The modulation frequency $f_A^m$ may be between a few MHz and a few tens MHz. In at least one embodiment, the power of the optical frequency components 331, 332 is much smaller compared to the total power of the optical super-channel signal. In some embodiments, the power of the optical frequency components 331, 332 may be, for example, less than 1% of the total power.

The side component frequencies $f_A$ and $f_B$ are in the range of C-band which is between about 191 and about 196 terahertz (THz). A side component spacing $f_A-f_B$ may be between 0 and a few GHz. In some embodiments, modulation frequencies $f_A^m$ and $f_B^m$ of first and second side frequency components 331, 332 are in the range of a few MHz or a few tens of MHz, and the side component spacing $f_A-f_B$ is in the range of a few hundred MHz.

Figure 5:
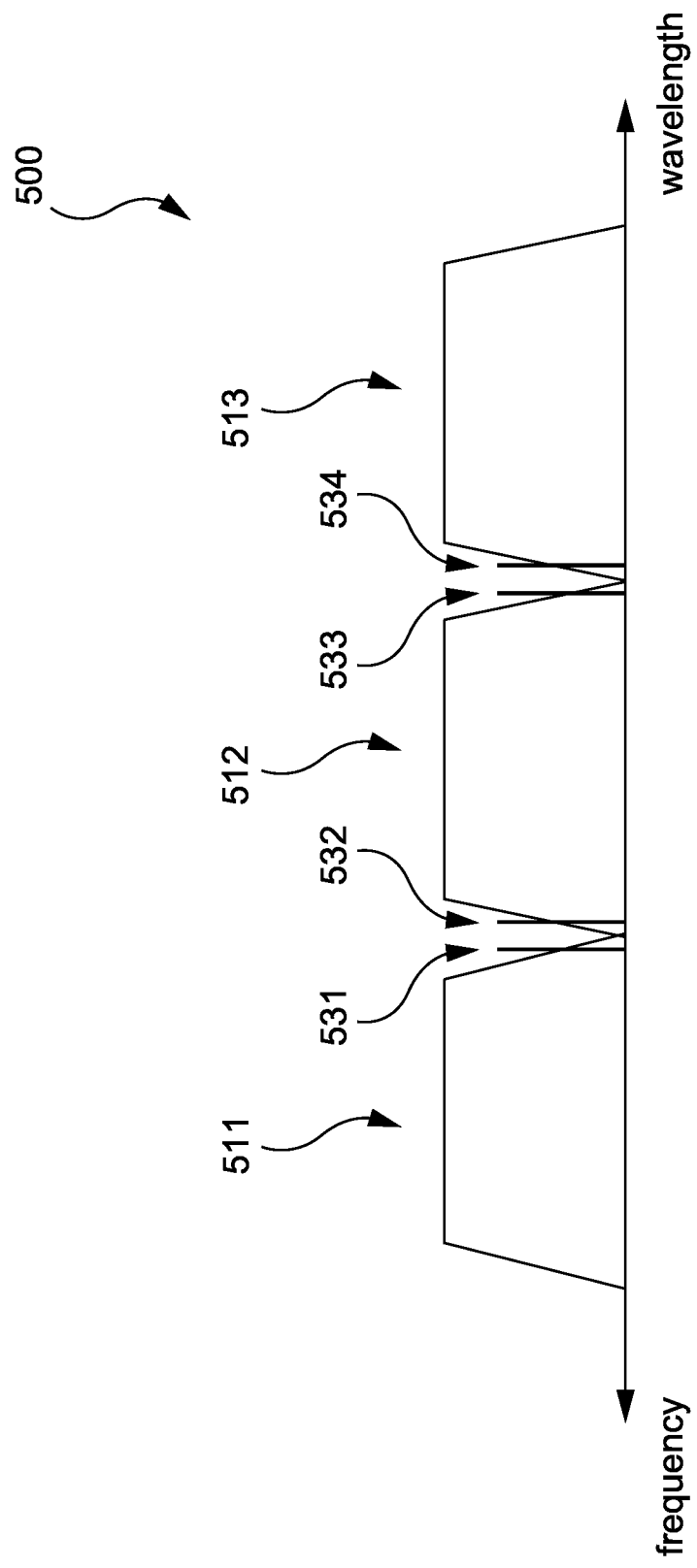
FIG. 5 depicts an illustration of three neighboring subcarriers having side frequency components, generated in accordance with various embodiments of the present disclosure.

FIG. 5 is an illustration of a spectral portion 500 with three neighboring subcarriers 511, 512, 513 having side frequency components 531, 532, 533, 534, in accordance with various embodiments of the present disclosure. In some embodiments, one subcarrier 512 may have two side frequency components 532, 533.

Referring back to FIG. 3, to transmit information over the fiber link, each of the two subcarriers 311, 312 is modulated with data (using MZMs 471a, 472b depicted in FIG. 4). After data modulation, the electrical fields of first and second subcarriers 311, 312 can be written as follows:

$$E_1(t)=E_{10}(t)\exp(-i2\pi f_1 t), \quad (6)$$

$$E_2(t)=E_{20}(t)\exp(-i2\pi f_2 t), \quad (7)$$

where $E_{10}(t)$ and $E_{20}(t)$ are the baseband complex electrical fields.

One can assume that the frequency difference between subcarrier optical center frequency $f_1$ of first subcarrier 311 and optical side component frequency $f_A$ of side frequency component 331 is positive: $\Delta f_{1,A}=f_1-f_A>0$. One can also assume that a difference between subcarrier optical center frequency $f_2$ of second subcarrier 312 and optical side component frequency $f_B$ of second side frequency component 332 is negative: $\Delta f_{2B}=f_2-f_B<0$. The electrical fields of first and second subcarriers 311, 312 may be derived as follows:

$$E_1(t)=[E_{10}(t)+A_A \exp(i2\pi\Delta f_{1A}t)]\exp(-i2\pi f_1 t), \quad (8)$$

$$E_2(t)=[E_{20}(t)+A_B \exp(i2\pi\Delta f_{2B}t)]\exp(-i2\pi f_2 t), \quad (9)$$

In some embodiments, side frequency component 331 (with optical side component frequency $f_A$) is located in a vicinity of an edge of the subcarrier spectrum of first subcarrier 311. However, side frequency component 331 may have any frequency within the bandwidth of the corresponding subcarrier 311 (e.g., within the bandwidth $\Delta f_1$ of first subcarrier 311).

In some embodiments, for convenience, the differences between the central subcarrier frequencies and side component frequencies may be equal: $|\Delta f_{1A}|=|\Delta f_{2B}|$. Referring again to FIG. 3, one may derive that a controlling difference between side component frequencies of two neighboring side frequency components 331, 332 is:

$$f_A-f_B=(f_1-f_2)-(|\Delta f_{1A}|-|\Delta f_{2B}|). \quad (10)$$

In equation (10), $f_1-f_2$ is a target subcarrier spacing between two neighboring subcarriers 311, 312. The target subcarrier spacing $f_1-f_2$ may be pre-determined, for example, from the design of the optical link. If $(|\Delta f_{1A}|+|\Delta f_{2B}|)$ is known, a difference between two neighbouring side frequency components $f_A-f_B$ is maintained constant at a desired value in order to maintain the target subcarrier spacing $f_1-f_2$ constant.

Figure 6:
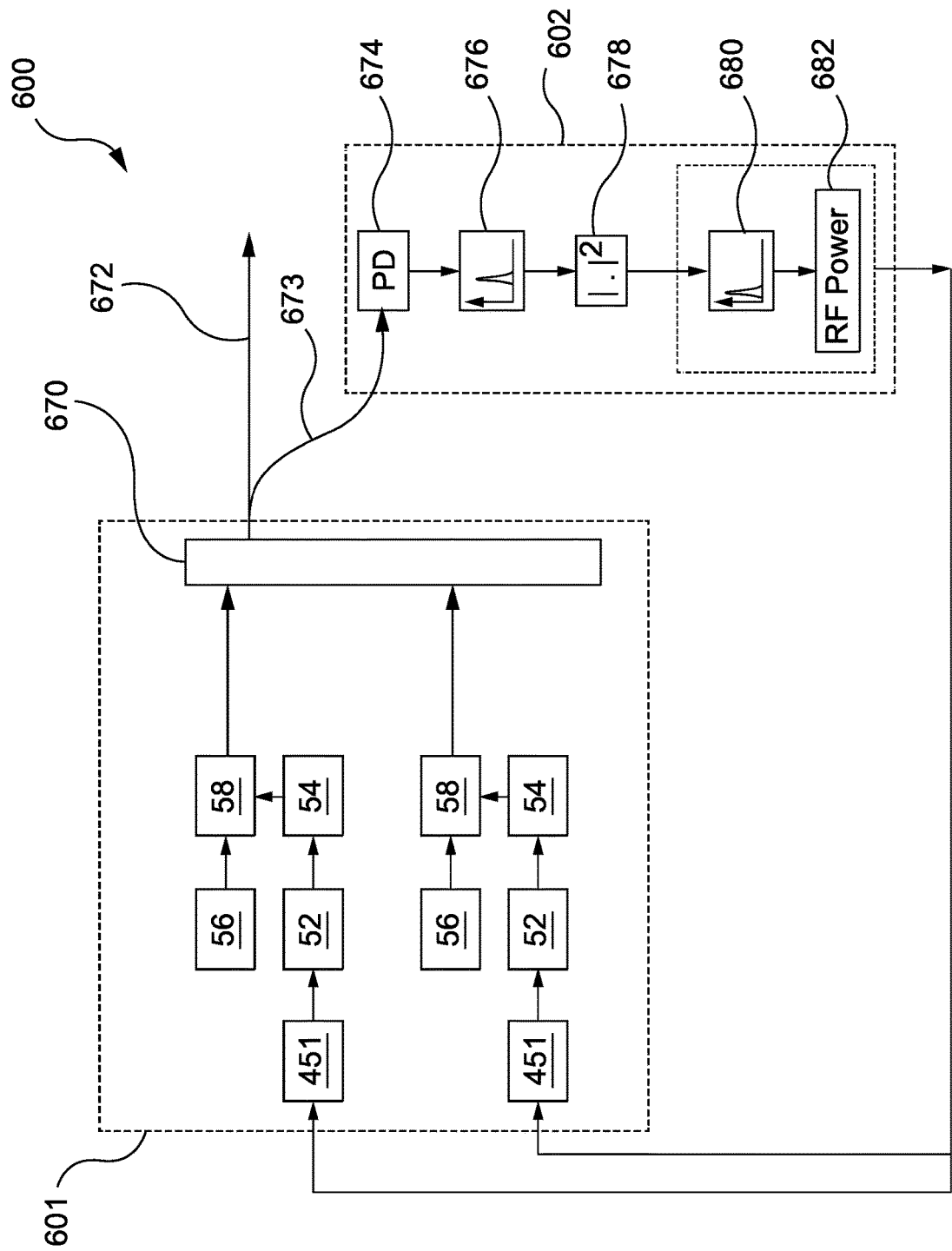
FIG. 6 depicts an apparatus configured to detect a variation of a difference between two neighbouring side frequency components, in accordance with various embodiments of the present disclosure.

FIG. 6 depicts an apparatus 600 configured to detect the difference between side component frequencies $f_A, f_B$ of two neighbouring side frequency components, in accordance with various embodiments of the present disclosure.

It should be noted that, although the apparatus is depicted for two subcarriers, it may be configured to detect subcarrier spacings for pairs defined between any number of subcarriers. In some embodiments, one subcarrier may be selected to be a master subcarrier and the other subcarriers may be slaves. The slave subcarriers may track (follow) the master subcarrier.

The apparatus 600 comprises a signal generator 601 and a controller 602. The signal generator 601 comprises DAC converters 52, electrical drivers 54, lasers 56 and EO modulators 58, which have been described above.

The DSPs 451 were discussed and depicted in further details in FIG. 4. The DSPs 451 cause the optical signal with subcarriers 311, 312 to have side frequency components 331, 332 (illustrated in FIG. 3). The side frequency components 331, 332 at $f_A$ and $f_B$ are modulated at side modulation frequencies $f_A{}^m$, $f_B{}^m$. Two subcarriers 311, 312 with side frequency components 331, 332 are coupled by a coupler 670. The output optical signal of coupler 670 comprises a first subcarrier at frequency $f_1$ with a first side frequency component at $f_A$ and a second subcarrier at frequency $f_2$ with a second side frequency component at $f_B$.

At the output of coupler 670, one portion of light 672 in the output optical signal may be transmitted to the optical link (not depicted), while another portion of light 673 may be tapped to controller 602 in order to determine the side component spacing $f_A-f_B$, as described below.

The tapped light 673 is converted to photocurrent by a photodetector (PD) 674. The PD 674 is a low-pass PD and may have a bandwidth that is larger than the designed spacing $|f_A-f_B|$. In some embodiments, the photocurrent may be amplified by a transimpedance amplifier (not depicted).

In at least one embodiment, frequencies of each of side frequency components 331, 332 relative to subcarrier frequencies $f_1$ and $f_2$, $|\Delta f_{1A}|=|\Delta f_{2B}|$, may be chosen such that a side component spacing $f_A-f_B$ is equal to the filter center frequency of a first electronic filter 676 in FIG. 6. In at least one embodiment, the first electronic filter 676 is a bandpass filter with a narrow passband, as described herein.

The optical electric field for side frequency components 331, 332, $E_A$ and $E_B$, respectively, may be written as follows:

$$E_A(t) = A_A \exp(-i2\pi f_A t)\cos\left(2\pi\frac{1}{2}f_A^m t\right), \quad (11)$$

$$E_B(t) = A_B \exp(-i2\pi f_B t)\cos\left(2\pi\frac{1}{2}f_B^m t\right), \quad (12)$$

where $A_A$ and $A_B$ are the amplitudes, and t is time.

When side frequency components 331, 332 are transmitted together, the optical intensity is:

$$I(t)=|E_A(t)+E_B(t)|^2, \quad (13)$$

Taking into account equations for optical electric field for side frequency components 331, 332 of equations (11)-(12), one may re-write the intensity as follows:

$$I(t) = A_A^2 \cos^2\left(2\pi\frac{1}{2}f_A^m t\right) + A_B^2 \cos^2\left(2\pi\frac{1}{2}f_B^m t\right) + \\ 2A_A A_B \cos(2\pi(f_A-f_B)t)\cos\left(2\pi\frac{1}{2}f_A^m t\right)\cos\left(2\pi\frac{1}{2}f_B^m t\right) \quad (14)$$

The photocurrent and voltage $V_{PD}(t)$ generated by PD 674 are proportional to optical intensity $I(t)$ of equation (14):

$$V_{PD}(t)\sim I(t). \quad (15)$$

It should be noted that the equations provided herein assume that side frequency components 331, 332 have the same polarization, which can be provided by optical design of MZMs 472a, 472b.

The first two terms of equation (14) separately contain information about side frequency component 331 and side frequency component 332. The last term of equation (14) contains the side component spacing $(f_A-f_B)$. However, the information cannot be extracted by detecting side frequency components 331, 332, the tone corresponding to their sum $f_A{}^m+f_B{}^m$ or to their difference $f_A{}^m-f_B{}^m$, because the fast changing beat factor $\cos(2\pi(f_A-f_B)t)$ averages these tones out.

In order to detect side frequency components 331, 332, or the tones corresponding to their sum or difference, it is necessary to have a non-zero factor $\cos(2\pi(f_A-f_B)t)$ after averaging. In some embodiments, this may be achieved by a squaring operation. It should be noted that other operations may also be used to obtain a non-zero factor $\cos(2\pi(f_A-f_B)t)$ after averaging.

In at least one embodiment, the first two terms of equation (14) accounting for base-band beating can be neglected if a bandpass filter is applied to the signal. The bandpass filter may be designed such that the only term of equation (14) that may pass the bandwidth of the bandpass filter is the last term of equation (14).

Referring again to FIG. 6, the electrical signal generated by the PD 674 is filtered by first electronic filter 676. The first electronic filter 676 is a narrow bandpass analog electronic filter.

Figure 7:
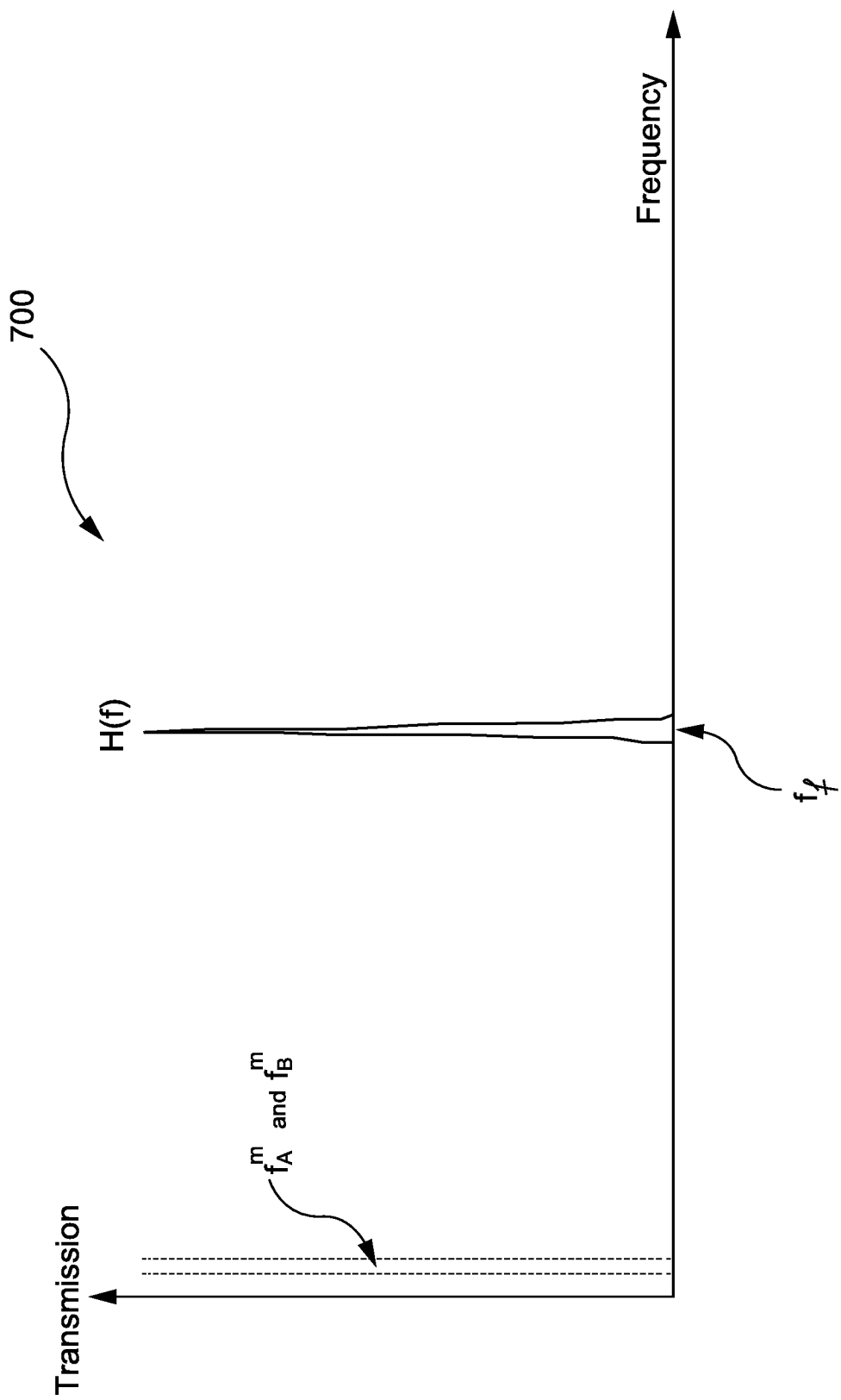
FIG. 7 illustrates a transfer function of a first electronic filter of the apparatus depicted in FIG. 6, in accordance with various embodiments of the present disclosure.

FIG. 7 is an illustration of the transfer function H of first electronic filter 676 of FIG. 6, in accordance with at least one embodiment of the present technology.

A filter center frequency $f_f$ of first electronic filter 676 may be set to a specific frequency chosen such that it corresponds to a desired difference between $f_A$ and $f_B$. The center frequency $f_f$ of first electronic filter 676 is chosen to be significantly higher than $f_A^m$ and $f_B^m$, so that only the beat term $f_A-f_B$ can pass through the first electronic filter 676.

For example, the center frequency $f_f$ of first electronic filter 676 may be 300 MHz. The passband of first electronic filter 676 may be a few MHz.

When the optical signal passes through first electronic filter 676, the base-band $f_A^m$ and $f_B^m$ tones are significantly attenuated. Referring to equation (14), the first electronic filter 676 is configured to pass through only the last (third) term of equation (14), which is:

$$2A_A A_B \cos(2\pi(f_A-f_B)t)\cos\left(2\pi\frac{1}{2}f_A^m t\right)\cos\left(2\pi\frac{1}{2}f_B^m t\right). \quad (16)$$

The difference between side component frequencies, i.e. side component spacing $f_A-f_B$, determines the beat term. The beat term corresponding to side component spacing $f_A-f_B$ passes through first electronic filter 676.

The locking range is determined by filter parameters of first electronic filter 676 such as, for example, center frequency, bandwidth, roll-off, etc. In at least one embodiment, the transfer function H of first electronic filter 676 acts as an etalon for optical wavelength locker with a much higher finesse.

As depicted in FIG. 6, after passing through first electronic filter 676, the intensity is then squared by a squaring device 678. The squaring device 678 is configured to perform a square operation on the photocurrent (intensity of the optical signal). For example, the squaring device 678 may comprise a multiplier. In some embodiments, the square operation may be performed by a splitter and the multiplier.

After squaring the last term of the equation (14), the squared voltage that is obtained at the output of the squaring device 678 is:

$$I^2(t) = 2|H(f_A-f_B)|^2 A_A^2 A_B^2 \cos^2\left(2\pi\frac{1}{2}f_A^m t\right)\cos^2\left(2\pi\frac{1}{2}f_B^m t\right) \quad (17)$$

Equation (17) may be rewritten as follows:

$$I^2(t) = 2|H(f_A-f_B)|^2 A_A^2 A_B^2 \frac{1+\cos(2\pi f_A^m t)}{2}\frac{1+\cos(2\pi f_B^m t)}{2} \quad (18)$$

In at least one embodiment, the term corresponding to the difference frequency $f_A^m-f_B^m$ may be detected. It should be noted that in some embodiments, a sum frequency term $f_A^m+f_B^m$ may also be detected.

The power is therefore proportional to the following term, which one may detect $$I^2(t)=2|H(f_A-f_B)|^2 A_A^2 A_B^2 \cos(2\pi(f_A^m-f_B^m)t) \quad (19)$$

where H(f) is an amplitude transfer function of first electronic filter 676.

The detected power of the difference frequency tone measured at frequency $f_A^m-f_B^m$ is:

$$P \propto A_A^2 A_B^2 (f_A-f_B). \quad (20)$$

Referring again to FIG. 6, after the squaring operation performed by squaring device 678, the optical signal passes through a second electronic filter 680. The second electronic filter 680 is configured to filter radio-frequency (RF) power of the RF signal about a modulated beat frequency tone.

It should be noted that, in at least one embodiment, both first electronic filter 676 and second electronic filter 680 are narrow bandpass filters. The second electronic filter 680 may have a very narrow pass band, such as several kilohertz (kHz). The first electronic filter 676 is configured to pass through the beat term $f_A-f_B$, while the second electronic filter 680 is configured to pass through the modulated beat frequency tone. In some embodiments, the modulated beat frequency tone is a difference between the first side modulation frequency and the second side modulation frequency $|f_A^m-f_B^m|$ (also referred to herein as a "difference frequency"). In some other embodiments, the modulated beat frequency tone is a sum of the first side modulation frequency and the second side modulation frequency ($f_A^m+f_B^m$).

Referring to equation (19), in some embodiments, correlation may be used to detect the beat term. The controller 602 may have other devices that can generate another cosine function $\cos(2\pi(f_A^m-f_B^m)t)$ and multiply the power expressing by equation (19). This additional multiplication operation may permit detecting the power of the beat term $f_A-f_B$, and therefore monitor the beat term $f_A-f_B$.

In some embodiments, an RF peak power detector may be used to detect the modulated frequency difference $|f_A^m-f_B^m|$.

As depicted in FIG. 6, an RF power meter 682 measures the power of the modulated frequency difference $|f_A^m-f_B^m|$.

From equation (20), one can understand that the RF power received by the RF power meter 682 is maximized when the difference between side component frequencies of side frequency components 331, 332 is lined up to the center of the second bandpass filter 680. By maximizing the RF power at modulated frequency difference $f_A^m-f_B^m$, one may maintain constant the difference between the side component frequencies, i.e. side component spacing, $f_A-f_B$. It should be noted that by maximizing the RF power at the modulated frequency difference $f_A^m-f_B^m$, one may lock the side component spacing, $f_A-f_B$ to the center frequency of first bandpass filter 676.

A control algorithm may be used to control the optical frequencies of lasers 456a, 456b, so that the RF power detected by RF power meter 682 is maximal. In some embodiments, dithering of the laser frequency may be used to provide tuning direction information for controlling the optical frequencies of lasers 456a, 456b based on the power detected by RF power meter 682.

In some embodiments, the modulated beat frequency tone is a sum of the modulation frequencies of side frequency components, $f_A{}^m+f_B{}^m$. The RF peak of the sum $f_A{}^m+f_B{}^m$, may be detected by RF power meter 682 and used to control the optical frequencies 456a, 456b in a similar manner. In such embodiments, first electronic filter 676 is configured to filter a sum of the modulation frequencies of side frequency components, $f_A{}^m+f_B{}^m$, and second electronic filter 680 is configured to filter RF peak of the sum of first side modulation frequency and second side modulation frequency, $f_A{}^m+f_B{}^m$.

In the embodiment depicted in FIG. 6, analog components are used to monitor the modulated beat frequency tone. In other embodiments, the monitoring of the modulated beat frequency tone may be performed in a digital domain. An analog-to-digital convertor (ADC) (not depicted) may convert the signal generated by PD 674 to the digital domain using. Then, filtering and other operations as discussed herein may be performed by digital processing in order to extract the RF power of modulated beat frequency tone.

In at least one embodiment, a non-transitory computer readable medium with computer executable instructions stored thereon may be provided. The computer executable instructions may be executed by a processor. First, the processor may filter the digital signal to obtain a filtered digital signal within a first bandwidth by attenuating the digital signal around a first side modulation frequency and a second side modulation frequency. Then, filtered digital signal is squared and then filtered again to obtain the RF power at the modulated beat frequency tone.

Figure 8:
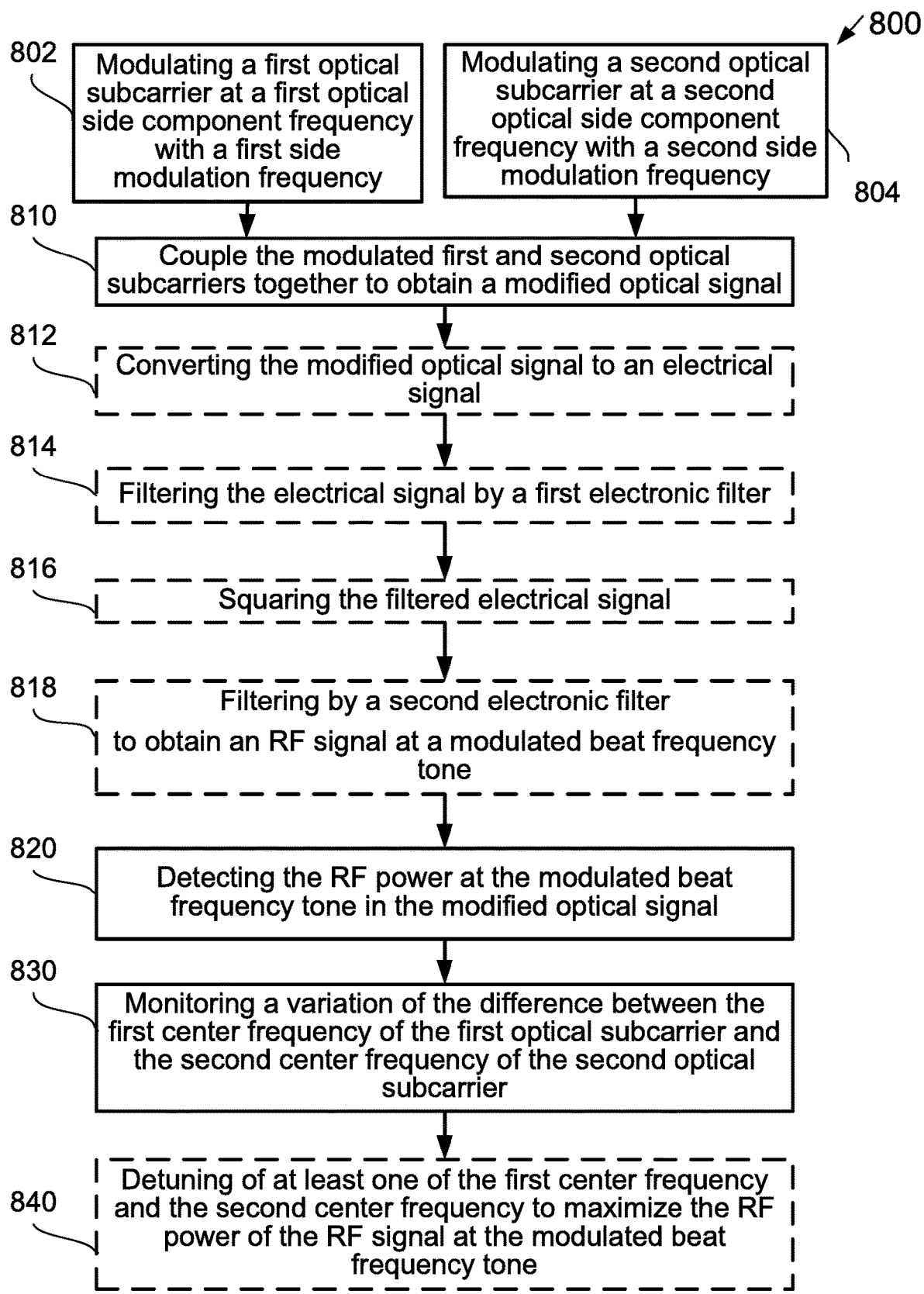
FIG. 8 depicts a flowchart illustrating a method for controlling a difference between a first center frequency of a first optical subcarrier and a second center frequency of a second optical subcarrier of an optical super-channel signal in an optical network, in accordance with various embodiments of the present disclosure.

FIG. 8 depicts a flowchart illustrating a method for controlling a difference between a first center frequency $f_1$ of a first optical subcarrier and a second center frequency $f_2$ of a second optical subcarrier of the optical super-channel signal in the optical network, in accordance with various embodiments of the present disclosure.

At step 802, the first optical subcarrier is modulated at a first optical side component frequency $f_A$ with a first side modulation frequency $f_A{}^m$. The difference between the first optical side component frequency and the first center frequency of the first subcarrier, $\Delta f_{1A}=f_1-f_A$, is maintained constant.

At step 804, the second optical subcarrier is modulated at a second optical side component frequency $f_B$ with a second side modulation frequency $f_B{}^m$. The difference between the second optical side component frequency and the second center frequency of the first subcarrier, $\Delta f_{2B}=f_2-f_B$, is maintained constant. In at least one embodiment, the difference between the first optical side component frequency and the second optical side component frequency is smaller than a difference between the first center frequency and the second center frequency.

At step 810, the modulated first and second optical subcarriers are coupled together to obtain a modified optical signal.

At step 812, the modified optical signal may be converted to electrical signal.

At step 814, the electrical signal may then be filtered by a first bandpass electronic filter. The first electronic filter has a bandwidth corresponding to a difference between the first optical side component frequency and the second optical side component frequency, i.e. side component spacing, $f_A-f_B$.

At step 816, the filtered electrical signal may be squared.

At step 818, the squared electrical signal may be filtered by the second electronic filter to obtain the RF signal at the modulated beat frequency tone $(f_A{}^m+f_B{}^m)$ or $(f_A{}^m-f_B{}^m)$. The modulated beat frequency tone bears information of the first side modulation frequency and the second side modulation frequency by being either a sum $(f_A{}^m+f_B{}^m)$ or a difference $f_A{}^m-f_B{}^m$ of the first side modulation frequency and the second side modulation frequency.

At step 820, the RF power is detected at the modulated beat frequency tone in the modified optical signal.

At step 830, a variation of the difference between the first center frequency $f_1$ of the first optical subcarrier and the second center frequency $f_2$ of the second optical subcarrier is monitored. As discussed above, the RF power, monitored at step 820, is related to the side component spacing $f_A-f_B$. The monitored RF power is smaller if the side component spacing $f_A-f_B$ is away from the desired value. To reduce deviation of the difference between the first center frequency $f_1$ of the first optical subcarrier and the second center frequency $f_2$ of the second optical subcarrier (i.e. $f_1-f_2$) from the desired value, at least one of the first center frequency $f_1$ and the second center frequency $f_2$ may be tuned.

At step 840, at least one of the first center frequency $f_1$ and the second center frequency $f_2$ may be detuned to maximize the RF power of the RF signal at the modulated beat frequency tone.

Figure 9:
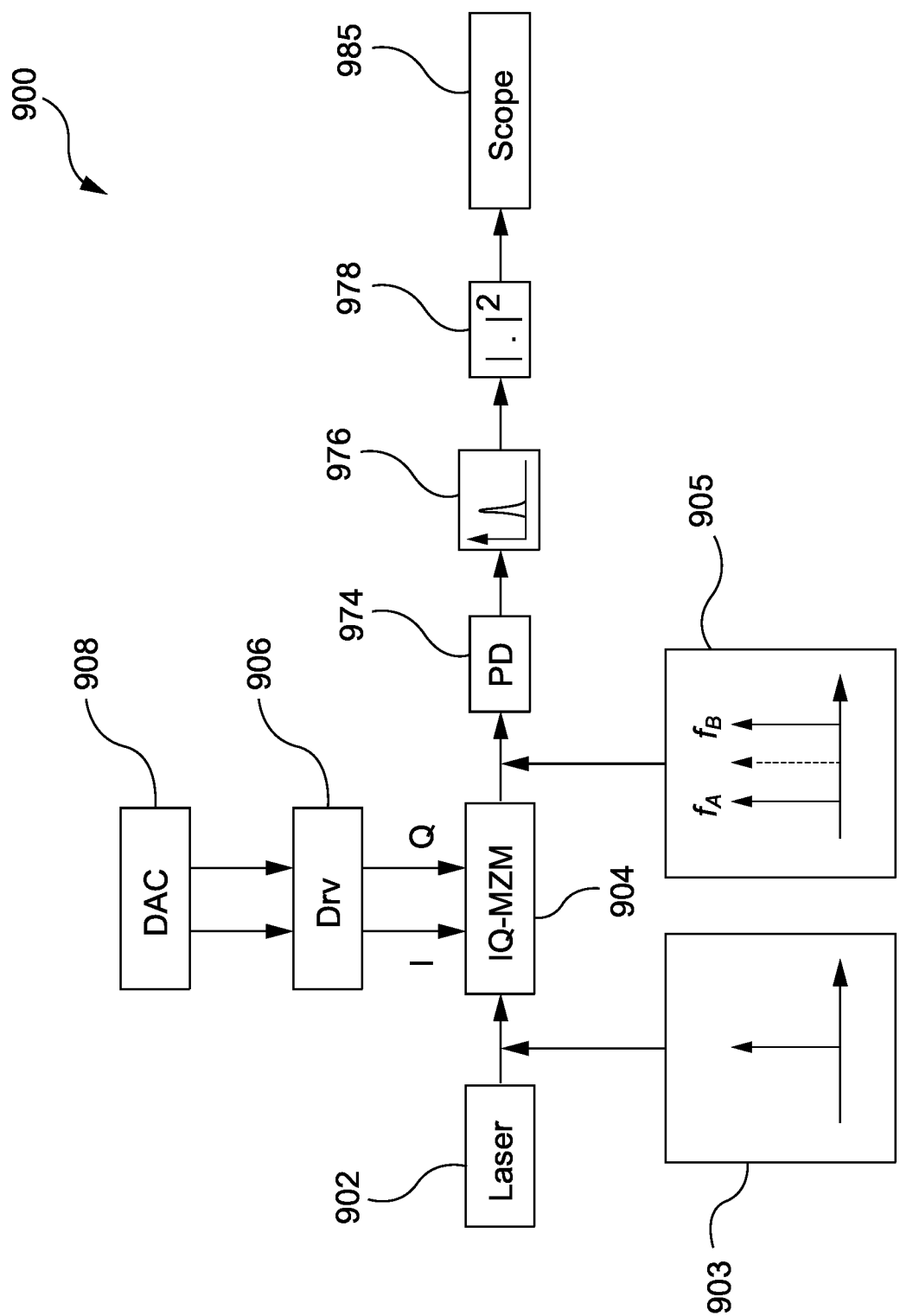
FIG. 9 depicts a block diagram of an experimental set-up for confirmation of detectability of variation of a side component spacing, in accordance with various embodiments of the present disclosure.

FIG. 9 depicts a block diagram of an experimental set-up 900 for confirmation of detectability of the side component spacing $f_A-f_B$. One laser 902 was used to generate two laser lines with known frequency spacing. Laser spectrum 903 of laser 902 is schematically illustrated in FIG. 9.

The output of a continuous wave (CW) laser 902 passes through in-phase quadrature phase MZM (IQ-MZM) 904. The IQ-MZM 904 is driven by a driver 906 and a DAC 908 to provide a frequency shift with envelope modulation. The IQ-MZM 904 modulates the laser output at 2.929 MHz and 3.9063 MHz. Two laser lines 905 at frequencies $f_A$, $f_B$ are schematically illustrated in FIG. 9. The optical signal is converted to photocurrent at PD 974 which has a low pass bandwidth of about 400 MHz.

The photocurrent then passes through a bandpass filter 976 with a bandwidth of about 50 MHz centered at about 300 MHz. The filtered signal is then squared by squaring device 678 and received by a scope 985. The power of the difference frequency tone, $f_A{}^m-f_B{}^m$, which is 3.9063−2.929=0.9773 MHz is then measured as a function of the spacing between 2 laser lines $f_A$ and $f_B$.

Figure 10:
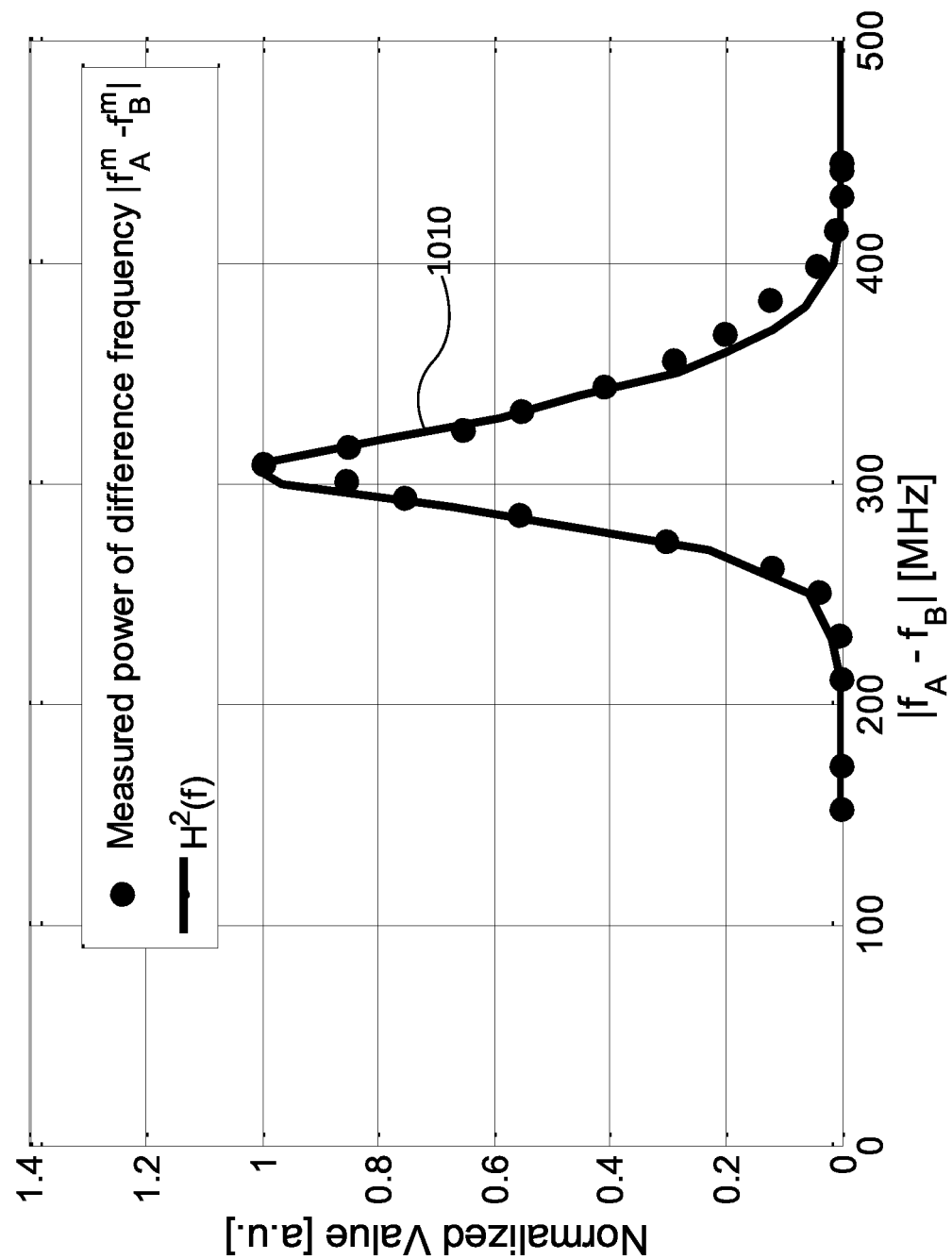
FIG. 10 depicts a power of a difference frequency tone measured using the set-up depicted in FIG. 9.

FIG. 10 depicts a power of the modulated frequency difference tone (beat tone), $|f_A{}^m-f_B{}^m|$, measured at the scope 985 of the set-up of FIG. 9. The frequency offset between two laser tones $f_A$, $f_B$ is swept between 150 MHz and 450 MHz. The power of the modulated frequency difference tone at 0.9773 MHz depends on the separation between frequencies $f_A$, $f_B$ and has a maximum when the laser frequency separation is around 300 MHz. The modulated frequency difference tone $|f_A{}^m-f_B{}^m|$ was measured to be 0.9773 MHz for each laser frequency spacing $f_A-f_B$.

In FIG. 10, curve 1010 depicts a squared transfer function of the passband filter 976. Dots depict measured power of difference frequency tone $|f_A{}^m-f_B{}^m|$.

The set-up and measurements of FIG. 9-10 illustrate that the measured power of difference frequency tone at $f_A{}^m-f_B{}^m$ may be indeed expressed by equation (20). The results illustrate that monitoring of $f_A{}^m-f_B{}^m$ may help to monitor the deviation of the subcarrier spacing $f_1-f_2$ from a desired value.

The described herein technique for controlling of the difference between center frequencies of optical subcarriers of an optical super-channel signal does not require an optical etalon. Furthermore, the second electronic filter acts as an RF frequency discriminator and provides a high resolution on the order of MHz. The RF components used in the technique as described herein may be low-speed, which can help to reduce the cost of the transmitter. The technique as described herein may help to lock the center frequencies of the subcarriers at a desired frequency separation. Moreover, such technique may allow for decreasing and increasing, on demand, of the frequency separation between the subcarriers.

It is to be understood that the operations and functionality of the disclosed methods and apparatuses may be achieved by hardware-based, software-based, firmware-based elements and/or combinations thereof. Such operational alternatives do not, in any way, limit the scope of the present disclosure.

It will also be understood that, although the inventive concepts and principles presented herein have been described with reference to specific features, structures, and embodiments, it is clear that various modifications and combinations may be made without departing from such disclosures. The specification and drawings are, accordingly, to be regarded simply as an illustration of the inventive concepts and principles as defined by the appended claims, and are contemplated to cover any and all modifications, variations, combinations or equivalents that fall within the scope of the present disclosure.

What is claimed is:

1. A method for controlling a difference between a first center frequency of a first optical subcarrier and a second center frequency of a second optical subcarrier of an optical super-channel signal in an optical network, the method comprising:
   modulating the first optical subcarrier at a first optical side component frequency with a first side modulation frequency;
   modulating the second optical subcarrier at a second optical side component frequency with a second side modulation frequency, a difference between the first optical side component frequency and the second optical side component frequency being smaller than a difference between the first center frequency and the second center frequency;
   coupling together the modulated first and second optical subcarriers to obtain a modified optical signal;
   converting the modified optical signal to an electrical signal;
   filtering the electrical signal by a first electronic filter to obtain a filtered electrical signal within a first bandwidth corresponding to the difference between the first optical side component frequency and the second optical side component frequency;
   squaring the filtered electrical signal;
   filtering again the filtered and squared electrical signal by a second electronic filter to obtain an RF signal at a modulated beat frequency tone; and
   measuring the RF power of the RF signal at the modulated beat frequency tone.

2. The method of claim 1, further comprising detuning at least one of the first center frequency and the second center frequency to maximize the RF power of the RF signal at the modulated beat frequency tone.

3. The method of claim 1, wherein
   a difference between the first optical side component frequency and the first center frequency of the first subcarrier is maintained constant, and
   a difference between the second optical side component frequency and the second center frequency of the second subcarrier is maintained constant.

4. The method of claim 1, wherein the modulated beat frequency tone is a difference between the first side modulation frequency and the second side modulation frequency.

5. The method of claim 1, wherein the modulated beat frequency tone is a sum of the first side modulation frequency and the second side modulation frequency.

6. An apparatus for controlling an optical super-channel signal in an optical network, the optical super-channel signal having a first optical subcarrier with a first center frequency and a second optical subcarrier with a second center frequency, the apparatus comprising:
   a first electro-optic modulator configured to: modulate the first optical subcarrier at a first optical side component frequency with a first side modulation frequency;
   a second electro-optic modulator configured to:
      modulate the second optical subcarrier at a second optical side component frequency with a second side modulation frequency, a difference between the first optical side component frequency and the second optical side component frequency being smaller than a difference between the first center frequency and the second center frequency;
   a coupler configured to couple together the modulated first and second optical subcarriers to obtain a modified optical signal;
   a photodetector configured to receive the modified optical signal and to generate an electrical signal;
   a first electronic filter configured to filter the electrical signal to obtain a filtered electrical signal within a first bandwidth having a center corresponding to a difference between the first optical side component frequency and the second optical side component frequency, the first electronic filter configured to significantly attenuate the electrical signal around the first side modulation frequency and the second side modulation frequency;
   a squaring device configured to square the filtered electrical signal; and
   a second electronic filter located between the squaring device and a RF power meter and configured to filter again the filtered and squared electrical signal within a second bandwidth having a center corresponding to a modulated beat frequency tone to obtain an RF signal, wherein
   the RF power meter is configured to measure an RF power of the RF signal at the modulated beat frequency tone.

7. The apparatus of claim 6, further comprising an amplifier configured to amplify the electrical signal after it was generated by the photodetector.

8. The apparatus of claim 6, wherein the squaring device comprises a splitter and a multiplier.

9. The apparatus of claim 6, wherein the modulated beat frequency tone is a difference between the first side modulation frequency and the second side modulation frequency.

10. The apparatus of claim 6, wherein the modulated beat frequency tone is a sum of the first side modulation frequency and the second side modulation frequency.

11. The apparatus of claim 6, wherein
- a difference between the first optical side component frequency and the first center frequency of the first subcarrier is maintained constant, and
- a difference between the second optical side component frequency and the second center frequency of the second subcarrier is maintained constant.

12. A non-transitory computer readable medium with computer executable instructions stored thereon that, when executed by a processor, cause the processor to:
- filter a digital signal to obtain a filtered digital signal within a first bandwidth by attenuating the digital signal around a first side modulation frequency and a second side modulation frequency;
- square the filtered digital signal;
- filter again the filtered and squared digital signal to obtain a radio-frequency (RF) signal at a modulated beat frequency tone, the modulated beat frequency tone bearing information of the first side modulation frequency and the second side modulation frequency; and
- determine an RF power of the RF signal at the modulated beat frequency tone;
- wherein the digital signal is obtained by detecting a portion of an optical super-channel signal, the optical super-channel signal having a first optical subcarrier with a first center frequency and a second optical subcarrier with a second center frequency;
- the first optical subcarrier at a first optical side component frequency is modulated with the first side modulation frequency;
- the second optical subcarrier at a second optical side component frequency is modulated with the second side modulation frequency, a difference between the first optical side component frequency and the second optical side component frequency being smaller than a difference between the first center frequency and the second center frequency.

13. The non-transitory computer readable medium of claim 12, wherein the modulated beat frequency tone is a difference between the first side modulation frequency and the second side modulation frequency.

14. The non-transitory computer readable medium of claim 12, wherein the modulated beat frequency tone is a sum of the first side modulation frequency and the second side modulation frequency.

\* \* \* \* \*